United States Patent
Greenlaw

(10) Patent No.: US 7,941,727 B2
(45) Date of Patent: May 10, 2011

(54) CHECKSUM GENERATOR FOR VARIABLE-LENGTH DATA

(75) Inventor: Jonathan E. Greenlaw, Roseville, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 1226 days.

(21) Appl. No.: 11/591,034

(22) Filed: Oct. 31, 2006

(65) Prior Publication Data
US 2008/0115040 A1    May 15, 2008

(51) Int. Cl.
*H03M 13/00*    (2006.01)
(52) U.S. Cl. ........................ 714/758; 714/752
(58) Field of Classification Search ............... 714/752, 714/758, 776
See application file for complete search history.

(56) References Cited

U.S. PATENT DOCUMENTS

| | | |
|---|---|---|
| 6,681,364 B1* | 1/2004 | Calvignac et al. ............ 714/776 |
| 6,848,072 B1 | 1/2005 | Milliken |
| 6,868,517 B1 | 3/2005 | Feng et al. |
| 6,901,551 B1 | 5/2005 | Corrigan, III |
| 6,904,558 B2 | 6/2005 | Cavanna et al. |
| 6,910,172 B2 | 6/2005 | Hara et al. |
| 6,934,902 B2 | 8/2005 | Hara et al. |
| 6,938,197 B2 | 8/2005 | Doubler et al. |
| 6,941,504 B2 | 9/2005 | Berry, Jr. et al. |
| 6,968,492 B1 | 11/2005 | Annadurai et al. |
| 6,993,705 B1 | 1/2006 | MacLellan |
| 7,139,963 B1* | 11/2006 | Fox ............................ 714/758 |
| 7,360,142 B1* | 4/2008 | Barash ........................ 714/758 |

* cited by examiner

*Primary Examiner* — Sam Rizk

(57) ABSTRACT

One embodiment relates to a method of generating an N-bit checksum for variable-length data. An N-bit data word of the variable-length data is received by data input circuitry, and an N-bit input checksum generator is used to calculate an updated value of the N-bit checksum for N-bit data words. A plurality of smaller checksum generators and the N-bit input checksum generator are each used to calculate a last value of the N-bit checksum for the last data word of the variable-length data. Control signals are used to controllably select the last value of the N-bit checksum from outputs of said checksum generators. Other embodiments and features are also disclosed.

22 Claims, 4 Drawing Sheets

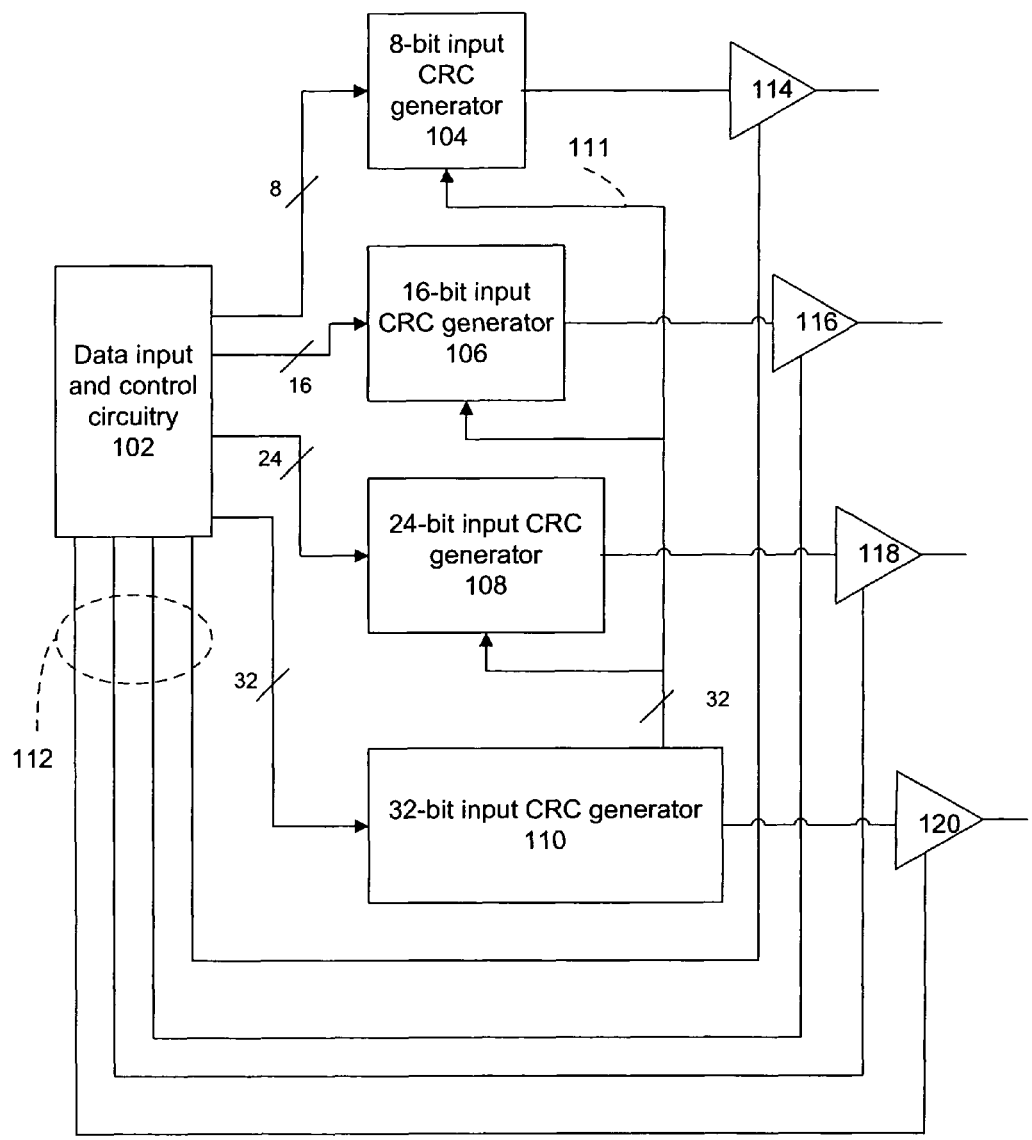
FIG. 1     100

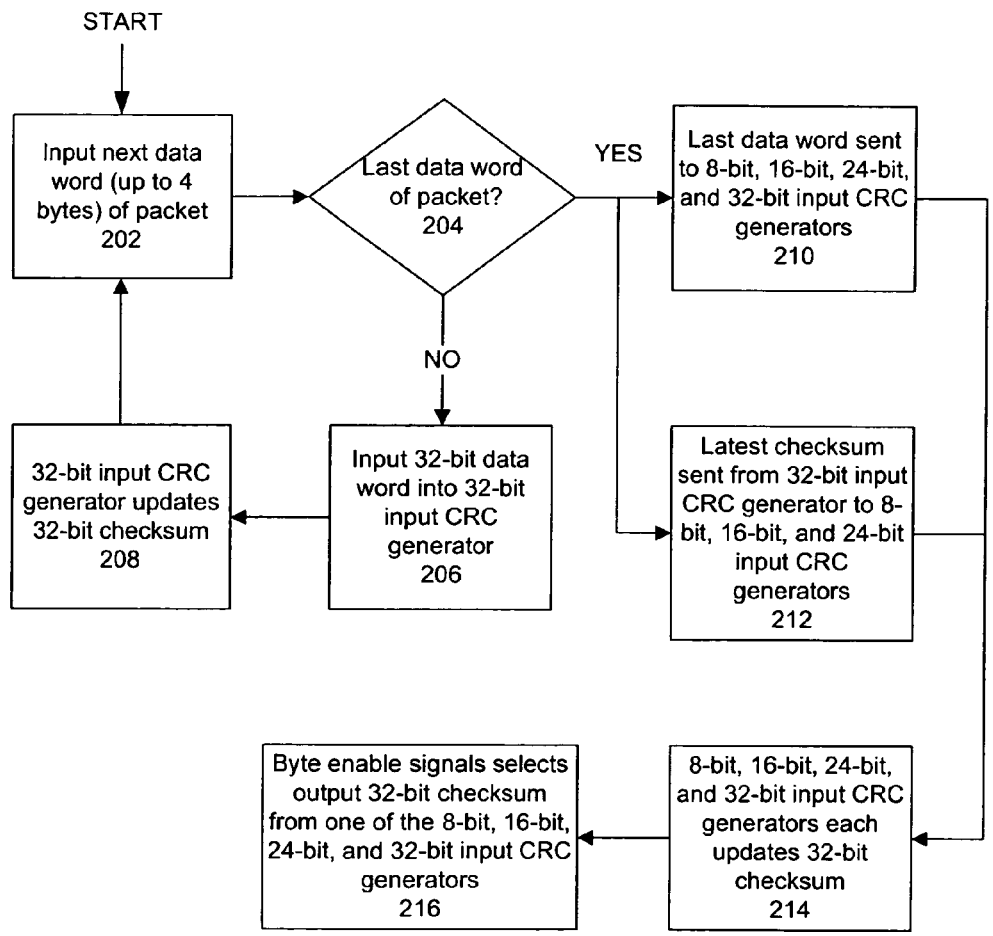
FIG. 2    200

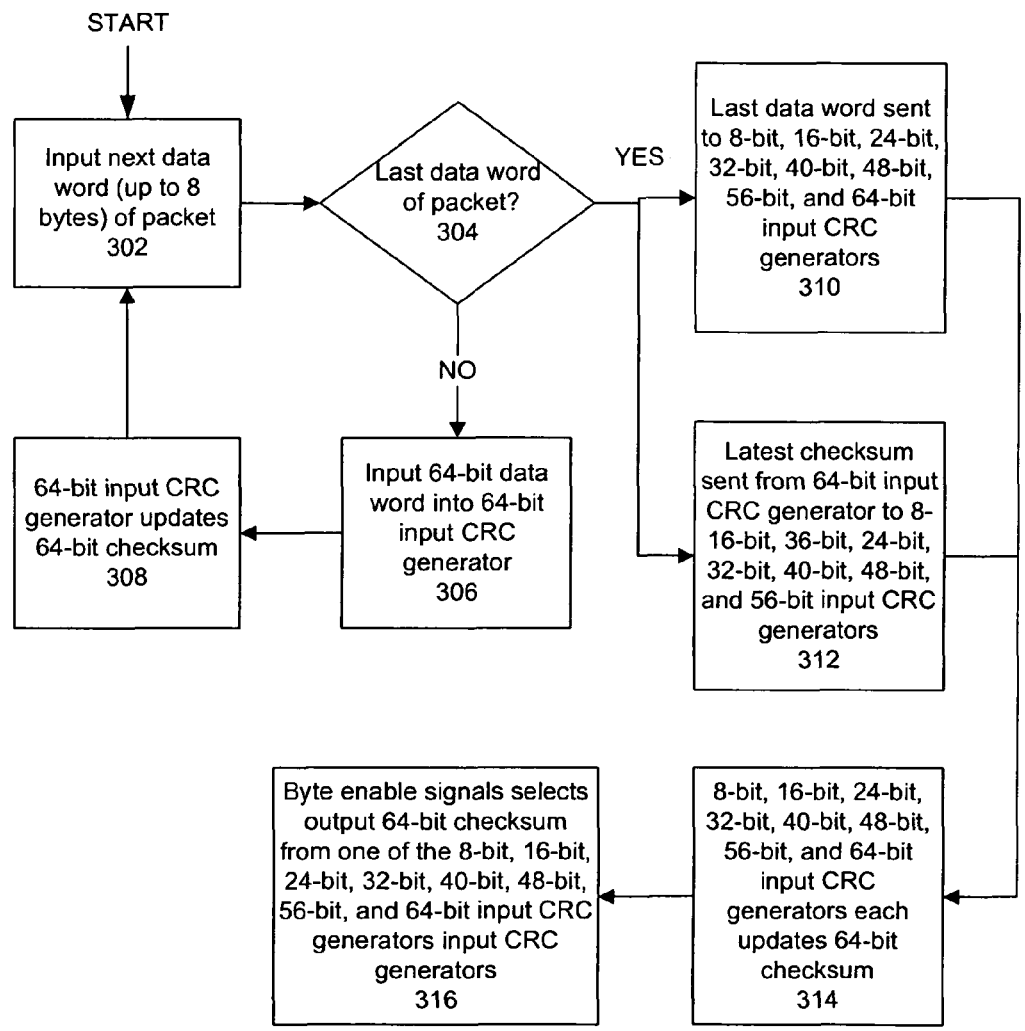
FIG. 3    300

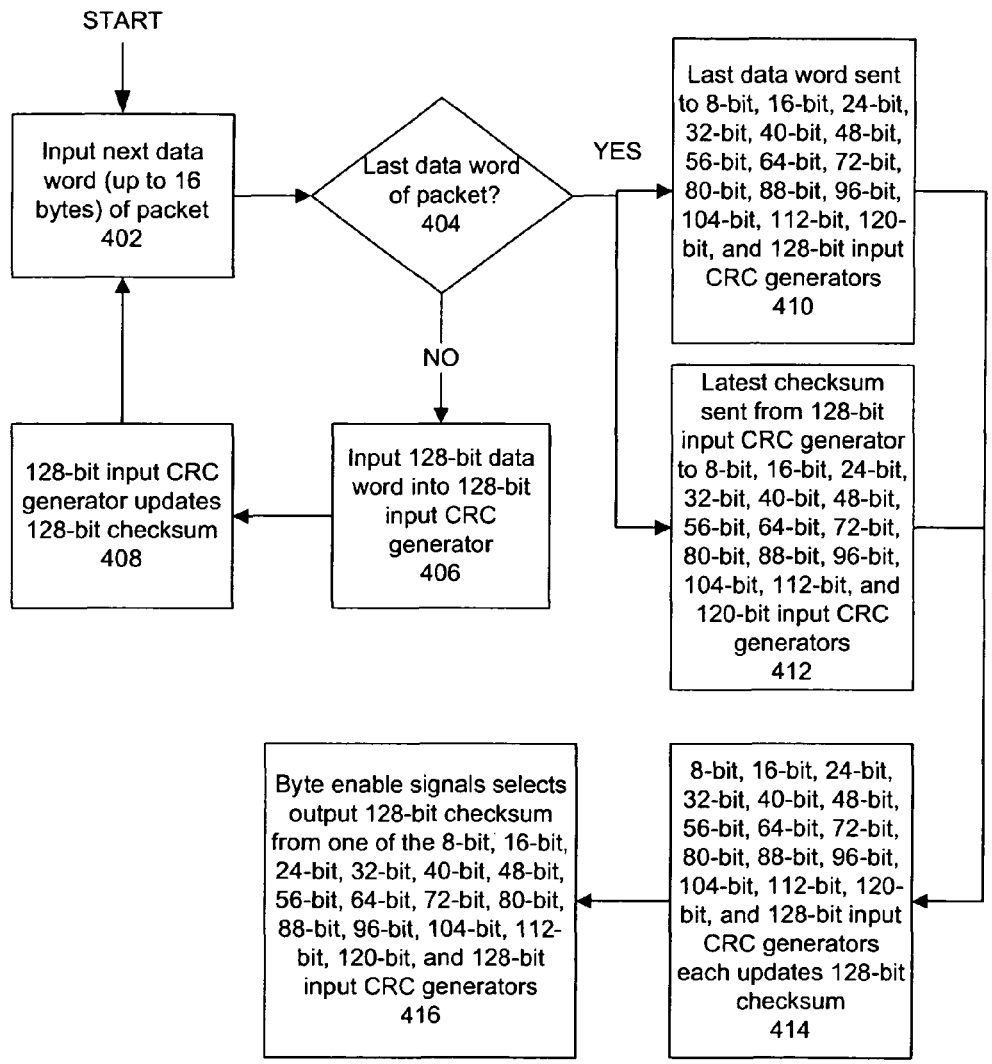
FIG. 4    400

CHECKSUM GENERATOR FOR VARIABLE-LENGTH DATA

BACKGROUND

1. Field of the Invention

The present disclosure relates generally to data processing technology, including computer technology, data storage technology, and data communications technology.

2. Description of the Background Art

In telecommunications, it is desirable for a receiver of message data transmitted through a noisy channel to have a way to determine whether any error was introduced into the message data during the transmission. To accomplish this aim, the transmitter may generate a checksum value which is a function of the message data and may append the checksum value to the message data.

One type of checksum is a cyclic redundancy checksum (CRC). A CRC is a type of checksum for error detection which is utilized by various data communication protocols. Under these protocols, a CRC value is typically computed for a packet and attached to the packet during transmission.

It is highly desirable to improve data processing technology, including computer technology, data storage technology, and data communications technology. It is particularly desirable to improve the high-speed generation of checksums for use in data communications and other applications.

SUMMARY

One embodiment relates to a method of generating an N-bit checksum for variable-length data. An N-bit data word of the variable-length data is received by data input circuitry, and an N-bit input checksum generator is used to calculate an updated value of the N-bit checksum for N-bit data words. A plurality of smaller checksum generators and the N-bit input checksum generator are each used to calculate a last value of the N-bit checksum for the last data word of the variable-length data. Control signals are used to controllably select the last value of the N-bit checksum from outputs of said checksum generators.

Another embodiment of the invention pertains to an apparatus for generating an N-bit checksum for variable-length data. Data input circuitry is configured to receive as input an N-bit data word of the variable-length data. An N-bit input checksum generator is configured to calculate an updated value of the N-bit checksum for N-bit data words. A plurality of smaller checksum generators are each configured to calculate a last value of the N-bit checksum for the last data word of the variable-length data. Control circuitry is configured to controllably select the last value of the N-bit checksum from outputs of said checksum generators.

Other embodiments and features are also disclosed.

BRIEF DESCRIPTION OF THE DRAWINGS

FIG. 1 is a flow chart of a method of generating a 32-bit checksum for variable-length data in accordance with an embodiment of the invention.

FIG. 2 is a schematic diagram of a 32-bit checksum generator for variable-length data in accordance with an embodiment of the invention.

FIG. 3 is a flow chart of a method of generating a 64-bit checksum for variable-length data in accordance with an embodiment of the invention.

FIG. 4 is a flow chart of a method of generating a 128-bit checksum for variable-length data in accordance with an embodiment of the invention.

DETAILED DESCRIPTION

Conventional CRC generators typically work with single bits or eight-bit data words and typically compute a CRC value with a 16-bit polynomial. Sufficient performance is usually achievable in conventional applications by using higher clock speeds with these conventional generators.

Recently, however, it has become more common for data packets to require the computation of a CRC value with a 32-bit polynomial. Use of a 32-bit polynomial provides for stronger error detection than use of a 16-bit polynomial. In other words, a 32-bit CRC value is capable of detecting more errors than a 16-bit CRC value.

In addition, recent standard interfaces use 32 bits in parallel and higher clock speeds. As such, performance requirements for CRC generators are now much greater.

One prior solution to the high-speed generation of a 32-bit CRC polynomial involves computation of the 32-bit CRC serially using an eight-bit data word. The use of an eight-bit (one byte) data word is well-adapted for applications where the length of the data is a variable number of data bytes. However, the performance of this serial technique is limited by the number of iterations which can be performed per clock cycle.

Another prior solution to the high-speed generation of a 32-bit CRC polynomial also uses an eight-bit data word, but it utilizes a look-up table to directly read the checksum values. Again, the use of an eight-bit (one byte) data word is well-adapted for applications where the length of the data is a variable number of data bytes. Unfortunately, the performance of this look-up table technique is limited by the large table size of 4 Gigabytes which would be required.

The present disclosure provides methods and apparatus for the high-speed generation of a 32-bit CRC polynomial for variable-length data. The methods and apparatus may be extended for the high-speed generation of larger CRC polynomials, such as a 64-bit CRC polynomial, a 128-bit CRC polynomial, and so on.

FIG. 1 is a schematic diagram of a 32-bit checksum generator 100 for a variable-length data packet in accordance with an embodiment of the invention. The generator 100 is configured to efficiently process 32-bits in parallel to generate the 32-bit checksum while allowing the data packet to be a variable number of bytes in length.

The data packet may be input one data word at a time into the data input and control circuitry 102. Here, one data word is 32-bits (4 bytes) of data. This 32-bit input is advantageously designed to match the 32-bit wide data word of a data communications interface, such as those in recent standards.

The data input and control circuitry 102 is communicatively connected to each of four CRC generators: an 8-bit input CRC generator 104, a 16-bit input CRC generator 106, a 24-bit input CRC generator 108, and a 32-bit input CRC generator 110.

Communication lines 111 connect the 32-bit input CRC generator 110 to each of the other three CRC generators (104, 106, and 108). These lines 111 may be configured to transmit the latest CRC value calculated by the 32-bit input CRC generator to the other three CRC generators.

Output selection circuitry 114, 116, 118, 120 and control lines 112 thereto are included. The output selection circuitry may be configured to select a 32-bit CRC value output from a select one of the four CRC generators. The particular output selected may be determined by control circuitry based on byte enable bits associated with a last data word of the data packet.

The operation of the 32-bit checksum generator 100 of FIG. 1 is now described in further detail in relation to the method 200 of FIG. 2.

FIG. 2 is a flow chart of a method 200 of generating a 32-bit checksum for a variable-length data packet in accordance with an embodiment of the invention. The method 200 efficiently processes 32-bits in parallel to generate the 32-bit checksum while allowing the data packet to be a variable number of bytes in length. In one implementation, the method 200 may be implemented using the circuitry 100 shown in FIG. 1.

The data packet may be input 202 one data word at a time into the CRC generator. Here, one data word is 32-bits (4 bytes) of data. This 32-bit input is advantageously designed to match the 32-bit wide data word of a data communications interface, such as those in recent standards.

A determination 204 may then be made as to whether the data word is the last data word of the data packet. If it is not the last data word of the packet, then the 32-bit data word is input 206 into a 32-bit input CRC generator. The 32-bit input CRC generator preferably comprises hardware circuitry configured to rapidly calculate an update of a 32-bit CRC value based on a 32-bit input. The 32-bit input CRC generator thus calculates or updates 208 the 32-bit checksum value based on the input 32-bit data word.

The method 200 thus continues to input 202 and process 32-bit data words to update 208 the 32-bit CRC value until the last data word of the data packet is input. If the packet is a variable number of bytes in length, then the last data word may be 32-bits wide, 24-bits wide, 16-bits wide, or 8-bits wide.

In accordance with an embodiment of the invention, the variable-length last data word may be sent 210 to each of four CRC generators: the 32-bit input CRC generator (also used to process the previous data words of the packet); a 24-bit input CRC generator; a 16-bit input CRC generator; and an 8-bit input CRC generator. In one implementation, the 24-bit input CRC generator may comprise hardware circuitry configured to rapidly calculate an update of a 32-bit CRC value based on a 24-bit input. Similarly, the 16-bit input CRC generator may comprise hardware circuitry configured to rapidly calculate an update of a 32-bit CRC value based on a 16-bit input, and the 8-bit input CRC generator may comprise hardware circuitry configured to rapidly calculate an update of a 32-bit CRC value based on an 8-bit input.

More particularly, the first 8 bits of the last data word may be sent to all four of the CRC generators. The second 8 bits, if any, of the last data word may be sent to the 16-bit input, the 24-bit input, and the 32-bit input CRC generators. The third 8 bits, if any, of the last data word may be sent to the 24-bit input and the 32-bit input CRC generators. Finally, the fourth 8 bits, if any, of the last data word may be sent to the 32-bit input CRC generator.

In addition, the latest checksum from the 32-bit input CRC generator is sent 212 to the 24-bit input, 16-bit input, and 8-bit input CRC generators. This latest checksum value is the 32-bit CRC value calculated so far by processing of the data words up until the last data word.

Thereafter, the 8-bit, 16-bit, 24-bit and 32-bit input CRC generators each updates 214 its value of the 32-bit checksum by performing an iteration of the CRC calculation. While each CRC generator calculates its own update of the 32-bit CRC value, only one of the four calculations will be valid. If the last data word is 8-bits wide, then the 8-bit input CRC generator will calculate the valid 32-bit CRC value. If the last data word is 16-bits wide, then the 16-bit input CRC generator will calculate the valid 32-bit CRC value. If the last data word is 24-bits wide, then the 24-bit input CRC generator will calculate the valid 32-bit CRC value. Finally, if the last data word is 32-bits wide, then the 32-bit input CRC generator will calculate the valid 32-bit CRC value.

In accordance with an embodiment of the invention, the valid output is selected 216 by using byte enable signals. If only the first byte of the last word is enabled (valid) while the other three bytes are disabled (invalid), then control circuitry selects the 32-bit CRC value that is output by the 8-bit input CRC generator. If the first two bytes of the last word are enabled (valid) while the last two bytes are disabled (invalid), then the control circuitry selects the 32-bit CRC value that is output by the 16-bit input CRC generator. If the first three bytes of the last word are enabled (valid) while the last byte is disabled (invalid), then the control circuitry selects the 32-bit CRC value that is output by the 24-bit input CRC generator. Finally, if all four bytes of the last word are enabled (valid), then the control circuitry selects the 32-bit CRC value that is output by the 32-bit input CRC generator.

The above-described technique for generating a 32-bit CRC value for a variable-length data packet is advantageous in that it may be implemented with a lower clock frequency. This is because up to 32 bits may be processed in parallel. In addition, the above-described technique may be implemented with reduced complexity because the CRC generators may be configured to run at the same speed as a 32-bit bus interface.

FIG. 3 is a flow chart of a method of generating a 64-bit checksum for a variable-length data packet in accordance with an embodiment of the invention. The method 300 efficiently processes 64-bits in parallel to generate the 64-bit checksum while allowing the data packet to be a variable number of bytes in length. In one implementation, the circuitry 100 shown in FIG. 1 may be extended to by additional circuitry so as to implement the method 300 of FIG. 3.

The data packet may be input 302 one data word at a time into the CRC generator. Here, one data word is 64-bits (8 bytes) of data. This 64-bit input is advantageously designed to match the 64-bit wide data word of a data communications interface.

A determination 304 may then be made as to whether the data word is the last data word of the data packet. If it is not the last data word of the packet, then the 64-bit data word is input 306 into a 64-bit input CRC generator. The 64-bit input CRC generator preferably comprises hardware circuitry configured to rapidly calculate an update of a 64-bit CRC value based on a 64-bit input. The 64-bit input CRC generator thus calculates or updates 308 the 64-bit checksum value based on the input 64-bit data word.

The method 300 thus continues to input 302 and process 64-bit data words to update 308 the 64-bit CRC value until the last data word of the data packet is input. If the packet is a variable number of bytes in length, then the last data word may be 64-bits wide, 56-bits wide, 48-bits wide, 40-bits wide, 32-bits wide, 24-bits wide, 16-bits wide, or 8-bits wide.

In accordance with an embodiment of the invention, the variable-length last data word may be sent 310 to each of eight CRC generators: the 64-bit input CRC generator (also used to process the previous data words of the packet); a 56-bit input CRC generator; a 48-bit input CRC generator; a 40-bit input CRC generator; a 32-bit input CRC generator; a 24-bit input CRC generator; a 16-bit input CRC generator; and an 8-bit input CRC generator. In one implementation, the 56-bit input CRC generator may comprise hardware circuitry configured to rapidly calculate an update of a 64-bit CRC value based on a 56-bit input. Similarly, the 48-bit input CRC generator may comprise hardware circuitry configured to rapidly calculate an update of a 64-bit CRC value based on a 48-bit input. The 40-bit input CRC generator may comprise hardware circuitry configured to rapidly calculate an update of a 64-bit CRC value based on a 40-bit input. The 32-bit input CRC generator may comprise hardware circuitry configured to rapidly calculate an update of a 64-bit CRC value based on a 32-bit input. The 24-bit input CRC generator may comprise hardware circuitry configured to rapidly calculate an update of a 64-bit CRC value based on a 24-bit input. The 16-bit input CRC generator may comprise hardware circuitry configured to rapidly calculate an update of a 64-bit CRC value based on an 16-bit input. Finally, the 8-bit input CRC generator may comprise hardware circuitry configured to rapidly calculate an update of a 64-bit CRC value based on an 8-bit input.

More particularly, the first 8 bits of the last data word may be sent to all eight of the CRC generators. The second 8 bits, if any, of the last data word may be sent to the 16-bit input, the 24-bit input, the 32-bit input, the 40-bit input, the 48-bit input, the 56-bit input, and the 64-bit input CRC generators. The third 8 bits, if any, of the last data word may be sent to the 24-bit input, the 32-bit input, the 40-bit input, the 48-bit input, the 56-bit input, and the 64-bit input CRC generators. The fourth 8 bits, if any, of the last data word may be sent to the 32-bit input, the 40-bit input, the 48-bit input, the 56-bit input, and the 64-bit input CRC generators. The fifth 8 bits, if any, of the last data word may be sent to the 40-bit input, the 48-bit input, the 56-bit input, and the 64-bit input CRC generators. The sixth 8 bits, if any, of the last data word may be sent to the 48-bit input, the 56-bit input, and the 64-bit input CRC generators. The seventh 8 bits, if any, of the last data word may be sent to the 56-bit input and the 64-bit input CRC generators. Finally, the last 8 bits, if any, of the last data word may be sent to the 64-bit input CRC generator.

In addition, the latest checksum from the 64-bit input CRC generator is sent 312 to the 56-bit input, 48-bit input, 40-bit input, 32-bit input, 24-bit input, 16-bit input, and 8-bit input CRC generators. This latest checksum value is the 64-bit CRC value calculated so far by processing of the data words up until the last data word.

Thereafter, each of the eight CRC generators updates 314 its value of the 64-bit checksum by performing an iteration of the CRC calculation. While each CRC generator calculates its own update of the 64-bit CRC value, only one of the eight calculations will be valid. If the last data word is 8-bits wide, then the 8-bit input CRC generator will calculate the valid 64-bit CRC value. If the last data word is 16-bits wide, then the 16-bit input CRC generator will calculate the valid 64-bit CRC value. If the last data word is 24-bits wide, then the 24-bit input CRC generator will calculate the valid 64-bit CRC value. If the last data word is 32-bits wide, then the 32-bit input CRC generator will calculate the valid 64-bit CRC value. If the last data word is 40-bits wide, then the 40-bit input CRC generator will calculate the valid 64-bit CRC value. If the last data word is 48-bits wide, then the 48-bit input CRC generator will calculate the valid 64-bit CRC value. If the last data word is 56-bits wide, then the 56-bit input CRC generator will calculate the valid 64-bit CRC value. Finally, if the last data word is 64-bits wide, then the 64-bit input CRC generator will calculate the valid 64-bit CRC value.

In accordance with an embodiment of the invention, the valid output is selected 316 by using byte enable signals. If only the first byte of the last word is enabled (valid) while the other seven bytes are disabled (invalid), then control circuitry selects the 64-bit CRC value that is output by the 8-bit input CRC generator. If the first two bytes of the last word are enabled (valid) while the last six bytes are disabled (invalid), then the control circuitry selects the 64-bit CRC value that is output by the 16-bit input CRC generator. If the first three bytes of the last word are enabled (valid) while the last five bytes are disabled (invalid), then the control circuitry selects the 64-bit CRC value that is output by the 24-bit input CRC generator. If the first four bytes of the last word are enabled (valid) while the last four bytes are disabled (invalid), then the control circuitry selects the 64-bit CRC value that is output by the 32-bit input CRC generator. If the first five bytes of the last word are enabled (valid) while the last three bytes are disabled (invalid), then the control circuitry selects the 64-bit CRC value that is output by the 40-bit input CRC generator. If the first six bytes of the last word are enabled (valid) while the last two bytes are disabled (invalid), then the control circuitry selects the 64-bit CRC value that is output by the 48-bit input CRC generator. If the first seven bytes of the last word are enabled (valid) while the last byte is disabled (invalid), then the control circuitry selects the 64-bit CRC value that is output by the 56-bit input CRC generator. Finally, if all eight bytes of the last word are enabled (valid), then the control circuitry selects the 64-bit CRC value that is output by the 64-bit input CRC generator.

The above-described technique for generating a 64-bit CRC value for a variable-length data packet is advantageous in that it may be implemented with a lower clock frequency. This is because up to 64 bits may be processed in parallel. In addition, the above-described technique may be implemented with reduced complexity because the CRC generators may be configured to run at the same speed as a 64-bit bus interface.

FIG. 4 is a flow chart of a method of generating a 128-bit checksum for a variable-length data packet in accordance with an embodiment of the invention. The method 400 efficiently processes 128-bits in parallel to generate the 128-bit checksum while allowing the data packet to be a variable number of bytes in length. In one implementation, the circuitry 100 shown in FIG. 1 may be extended to by additional circuitry so as to implement the method 400 of FIG. 4.

The data packet may be input 402 one data word at a time into the CRC generator. Here, one data word is 128-bits (16 bytes) of data. This 128-bit input is advantageously designed to match the 128-bit wide data word of a data communications interface.

A determination 404 may then be made as to whether the data word is the last data word of the data packet. If it is not the last data word of the packet, then the 128-bit data word is input 406 into a 128-bit input CRC generator. The 128-bit input CRC generator preferably comprises hardware circuitry configured to rapidly calculate an update of a 128-bit CRC value based on a 128-bit input. The 128-bit input CRC generator thus calculates or updates 408 the 128-bit checksum value based on the input 128-bit data word.

The method 400 thus continues to input 402 and process 128-bit data words to update 408 the 128-bit CRC value until the last data word of the data packet is input. If the packet is a variable number of bytes in length, then the last data word may be 128-bits wide, 120-bits wide, 112-bits wide, 104-bits wide, 96-bits wide, 88-bits wide, 80-bits wide, 72-bits wide, 64-bits wide, 56-bits wide, 48-bits wide, 40-bits wide, 32-bits wide, 24-bits wide, 16-bits wide, or 8-bits wide.

In accordance with an embodiment of the invention, the variable-length last data word may be sent 410 to each of sixteen CRC generators: the 128-bit input CRC generator (also used to process the previous data words of the packet); a 120-bit input CRC generator; a 112-bit input CRC generator; a 104-bit input CRC generator; a 96-bit input CRC generator; a 88-bit input CRC generator; a 80-bit input CRC generator; a 72-bit input CRC generator; a 64-bit input CRC generator; a 56-bit input CRC generator; a 48-bit input CRC generator; a 40-bit input CRC generator; a 32-bit input CRC generator; a 24-bit input CRC generator; a 16-bit input CRC generator; and an 8-bit input CRC generator. In one implementation, each N-bit input CRC generator may comprise hardware circuitry configured to rapidly calculate an update of a 64-bit CRC value based on an N-bit input.

In addition, the latest checksum from the 128-bit input CRC generator is sent 412 to the other fifteen CRC generators. This latest checksum value is the 128-bit CRC value calculated so far by processing of the data words up until the last data word.

Thereafter, each of the sixteen CRC generators updates 414 its value of the 128-bit checksum by performing an iteration of the CRC calculation. While each CRC generator calculates its own update of the 128-bit CRC value, only one of the eight calculations will be valid.

In accordance with an embodiment of the invention, the valid output is selected 416 by using byte enable signals. If only the first byte of the last word is enabled (valid) while the other fifteen bytes are disabled (invalid), then control circuitry selects the 128-bit CRC value that is output by the 8-bit input CRC generator. If only the first two bytes of the last word are enabled (valid), then the control circuitry selects the 128-bit CRC value that is output by the 16-bit input CRC generator. If only the first three bytes of the last word are enabled (valid), then the control circuitry selects the 128-bit CRC value that is output by the 24-bit input CRC generator. And so on.

The above-described technique for generating a 128-bit CRC value for a variable-length data packet is advantageous in that it may be implemented with a lower clock frequency. This is because up to 128 bits may be processed in parallel. In addition, the above-described technique may be implemented with reduced complexity because the CRC generators may be configured to run at the same speed as a 128-bit bus interface.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of generating an N-bit checksum for variable-length data, the method comprising:
   receiving as input an N-bit data word of the variable-length data;
   using an N-bit input checksum generator to calculate an updated value of the N-bit checksum for N-bit data words;
   using a plurality of smaller checksum generators and the N-bit input checksum generator to each calculate a corresponding last value of the N-bit checksum for a last data word of the variable-length data, wherein at least a common portion of the last data word is input to each of the plurality of smaller checksum generators and the N-bit input checksum generator to calculate the corresponding last values; and
   using control signals to controllably select one of the last values of the N-bit checksum from said checksum generators to output as the N-bit checksum for the variable-length data.

2. The method of claim 1, further comprising sending the updated value of the N-bit checksum from the N-bit input checksum generator to the smaller checksum generators prior to the calculations of the corresponding last values by the smaller checksum generators.

3. The method of claim 1, wherein the checksum comprises a cyclic redundancy checksum.

4. The method of claim 1, wherein N is at least 32.

5. The method of claim 1, wherein N is at least 64.

6. The method of claim 1, wherein N is at least 128.

7. The method of claim 1, wherein the control signals are derived from byte enable signals associated with the last data word.

8. The method of claim 1, wherein (N/8−1) smaller checksum generators are used.

9. The method of claim 1, further comprising repeating calculation of the updated value of the N-bit checksum using the N-bit input checksum generator as additional N-bit data words of the variable-length data are received.

10. The method of claim 1, wherein using the plurality of smaller checksum generators comprises using checksum generators having respective inputs each having a corresponding number of bits that is less than N.

11. The method of claim 1, wherein the selected last value is a valid last value of the N-bit checksum for the variable-length data, and non-selected of the last values are invalid last values of the N-bit checksum for the variable-length data.

12. An apparatus for generating an N-bit checksum for variable-length data, the apparatus comprising:
   data input circuitry configured to receive as input N-bit data words and a remainder data word of the variable-length data;
   an N-bit input checksum generator configured to iteratively calculate updated values of the N-bit checksum for successive ones of the N-bit data words;
   a plurality of smaller checksum generators, each configured to calculate a corresponding last value of the N-bit checksum for the remainder data word of the variable-length data, wherein the N-bit input checksum generator is configured to further generate a corresponding last value of the N-bit checksum for the remainder data word, and wherein at least a common portion of the remainder data word is input to each of the plurality of smaller checksum generators and the N-bit input checksum generator to calculate the corresponding last values; and
   control circuitry configured to controllably select one of the last values of the N-bit checksum from said checksum generators to output as the N-bit checksum for the variable-length data.

13. The apparatus of claim 12, further comprising communication lines configured to send a latest value of the N-bit checksum from the N-bit input checksum generator to the smaller checksum generators prior to using the smaller checksum generators to each calculate the corresponding last value of the N-bit checksum.

14. The apparatus of claim 12, wherein the checksum comprises a cyclic redundancy checksum.

15. The apparatus of claim 12, wherein N is selected from the group consisting of: (1) at least 32, (2) at least 64, and (3) at least 128.

16. The apparatus of claim 12, wherein the control circuitry is configured to byte enable signals associated with the last data word to controllably select one of the last values of the N-bit checksum.

17. The apparatus of claim 1, comprising (N/8−1) smaller checksum generators.

18. The apparatus of claim 12, wherein the smaller checksum generators have respective inputs each having a corresponding number of bits that is less than N.

19. The apparatus of claim 12, wherein the selected last value is a valid last value for the N-bit checksum for the variable-length data, and non-selected ones of the last values are invalid last values of the N-bit checksum for the variable-length data.

20. An integrated circuit configured to generate an N-bit checksum for variable-length data, the integrated circuit comprising:
 input circuitry configured to receive as input an N-bit data word of the variable-length data;
 an N-bit input checksum generator circuit configured to calculate an updated value of the N-bit checksum for N-bit data words;
 a plurality of smaller checksum generator circuits, each configured to calculate a corresponding last value of the N-bit checksum for a last data word of the variable-length data, wherein the N-bit input checksum generator circuit is configured to further generate a corresponding last value of the N-bit checksum for the last data word, wherein at least a common portion of the last data word is input to each of the plurality of smaller checksum generator circuits and the N-bit input checksum generator circuit to calculate the corresponding last values;
 communication lines configured to send a the updated value of the N-bit checksum from the N-bit input checksum generator circuit to the smaller checksum generator circuits prior to using the smaller checksum generator circuits to each calculate the corresponding last value of the N-bit checksum; and
 logic circuitry configured to controllably select one of the last values of the N-bit checksum from said checksum generator circuits to output as the N-bit checksum for the variable-length data.

21. The integrated circuit of claim 20, wherein N is at least 32.

22. The integrated circuit of claim 20, wherein the control circuitry is configured to utilize byte enable signals associated with the last data word to controllably select the last value of the N-bit checksum.

\* \* \* \* \*

UNITED STATES PATENT AND TRADEMARK OFFICE
CERTIFICATE OF CORRECTION

| | | |
|---|---|---|
| PATENT NO. | : 7,941,727 B2 | Page 1 of 1 |
| APPLICATION NO. | : 11/591034 | |
| DATED | : May 10, 2011 | |
| INVENTOR(S) | : Jonathan E. Greenlaw | |

It is certified that error appears in the above-identified patent and that said Letters Patent is hereby corrected as shown below:

In column 10, line 11, in Claim 20, delete "a the" and insert -- the --, therefor.

Signed and Sealed this
First Day of January, 2013

David J. Kappos
*Director of the United States Patent and Trademark Office*